(12) United States Patent
Seok et al.

(10) Patent No.: US 8,912,463 B2
(45) Date of Patent: Dec. 16, 2014

(54) PLASMA ARC TORCH POSITIONING APPARATUS

(75) Inventors: Kwang Mog Seok, Suwon-si (KR); Seong Dae Cho, Seongnam-si (KR)

(73) Assignee: KCC Corporation, Seoul (KR)

( * ) Notice: Subject to any disclaimer, the term of this patent is extended or adjusted under 35 U.S.C. 154(b) by 291 days.

(21) Appl. No.: 13/510,889

(22) PCT Filed: Dec. 14, 2010

(86) PCT No.: PCT/KR2010/008918
§ 371 (c)(1),
(2), (4) Date: May 18, 2012

(87) PCT Pub. No.: WO2011/074848
PCT Pub. Date: Jun. 23, 2011

(65) Prior Publication Data
US 2012/0241438 A1    Sep. 27, 2012

(30) Foreign Application Priority Data

Dec. 16, 2009 (KR) .................. 10-2009-0125556

(51) Int. Cl.
| | |
|---|---|
| *H01H 1/38* | (2006.01) |
| *H01H 1/44* | (2006.01) |
| *H05H 1/44* | (2006.01) |
| *B23K 10/00* | (2006.01) |
| *C01B 33/02* | (2006.01) |
| *H01L 31/18* | (2006.01) |
| *H05H 1/38* | (2006.01) |
| *B23K 10/02* | (2006.01) |

(52) U.S. Cl.
CPC .................. *H05H 1/44* (2013.01); *B23K 10/00* (2013.01); *C01B 33/02* (2013.01); *H01L 31/182* (2013.01); *H05H 1/38* (2013.01); *Y02E 10/546* (2013.01); *B23K 10/006* (2013.01); *B23K 10/02* (2013.01)
USPC .............. 219/121.48; 219/121.5; 219/121.56; 219/121.36

(58) Field of Classification Search
CPC ............. H05H 1/34; H05H 1/38; H05H 1/44; H05H 2001/34; C01B 33/02
See application file for complete search history.

(56) References Cited

U.S. PATENT DOCUMENTS 3,147,329 A * 9/1964 Gage .............................. 373/22
3,849,584 A * 11/1974 Paton et al. .............. 219/121.36

(Continued)

FOREIGN PATENT DOCUMENTS

JP          06031454 A  *  2/1994  ............. B23K 10/00
JP     1997-145254 A    6/1997

(Continued)

OTHER PUBLICATIONS

International Search Report dated Aug. 31, 2011, issued in PCT/KR2010/008918.

(Continued)

*Primary Examiner* — Joseph M Pelham
(74) *Attorney, Agent, or Firm* — Hammer & Associates, P.C.

(57) ABSTRACT

The present invention relates to an apparatus for adjusting a position of a plasma arc torch. The apparatus includes an elevation apparatus configured to raise and lower the plasma arc torch with respect to molten silicon, a rotary apparatus configured to circumferentially rotate the plasma arc torch with respect to the molten silicon, and an angle adjustment apparatus configured to adjust an angle of the plasma arc torch with respect to the molten silicon. In addition, a plurality of plasma arc torches is provided and radially disposed at predetermined intervals. Therefore, time consumed to melt solid silicon to form the initial molten silicon is reduced, and casting speed is increased. In addition, fusibility of a source material can be improved, the source material can be stably melted, and economic continuous casting and a high quality silicon ingot for a solar cell can be manufactured.

9 Claims, 3 Drawing Sheets

(56) References Cited

U.S. PATENT DOCUMENTS

| | | | |
|---|---|---|---|
| 4,770,109 A | 9/1988 | Schlienger | |
| 6,265,690 B1 * | 7/2001 | Fornsel et al. | 219/121.5 |
| 7,858,158 B2 * | 12/2010 | Aslami et al. | 427/569 |
| 8,461,487 B2 * | 6/2013 | Hoshino et al. | 219/383 |
| 8,524,188 B2 * | 9/2013 | Hoshino et al. | 423/349 |
| 2003/0150374 A1 * | 8/2003 | Sasatani et al. | 117/50 |
| 2003/0160033 A1 * | 8/2003 | Johnson et al. | 219/121.51 |
| 2008/0009126 A1 * | 1/2008 | Aslami et al. | 438/488 |
| 2008/0032063 A1 * | 2/2008 | Chang et al. | 427/578 |
| 2008/0185949 A1 * | 8/2008 | Jebsen et al. | 313/231.41 |
| 2010/0164353 A1 * | 7/2010 | Tsai et al. | 313/231.31 |
| 2010/0203350 A1 * | 8/2010 | Stoddard et al. | 428/620 |
| 2011/0129403 A1 * | 6/2011 | Stoddard et al. | 423/348 |
| 2011/0198336 A1 * | 8/2011 | Hoshino et al. | 219/383 |
| 2011/0200514 A1 * | 8/2011 | Hoshino et al. | 423/348 |
| 2011/0220143 A1 * | 9/2011 | Buske et al. | 134/1.1 |
| 2012/0181164 A1 * | 7/2012 | Ookubo et al. | 204/164 |
| 2014/0075997 A1 * | 3/2014 | Ookubo et al. | 65/347 |

FOREIGN PATENT DOCUMENTS

| | | | |
|---|---|---|---|
| JP | 11-241168 | 9/1999 | |
| JP | 2001-019593 | 1/2001 | |
| JP | 2001-019594 | 1/2001 | |
| JP | 2002-110399 A | 4/2002 | |
| JP | 2005-293945 A | 10/2005 | |
| WO | WO 9952333 A1 * | 10/1999 | H05H 1/34 |
| WO | WO 0050342 A1 * | 8/2000 | |

OTHER PUBLICATIONS

Changqi Liu, "Design of Cam Mechanism," Mechanical Industry Press, (Oct. 31, 2005).

* cited by examiner

PLASMA ARC TORCH POSITIONING APPARATUS

CROSS-REFERENCE TO RELATED APPLICATIONS

The present application is a U.S. National Phase patent application under 35 U.S.C. 371 of International Application No. PCT/KR2010/008918, filed Dec. 14, 2010, which claims priority to Korean Patent Application No. 10-2009-0125556, filed Dec. 16, 2009, both of which are expressly incorporated herein by reference in their entireties.

BACKGROUND

1. Field of the Invention

The present invention relates to a plasma arc torch used in a continuous silicon casting apparatus, and more particularly, to an apparatus for adjusting a position of a plasma arc torch capable of adjusting positions of a plurality of plasma arc torches radially disposed about a source material introduction part through simple operation.

2. Discussion of Related Art

A silicon wafer, which has been traditionally used as a substrate for a solar cell, is manufactured by thinly cutting a directionally solidified silicon ingot. Here, quality and cost of the silicon wafer are determined by quality and cost of the silicon ingot.

Accordingly, in order to increase the quality of the silicon wafer and reduce the cost thereof, manufacturing cost of a high quality directionally solidified silicon ingot should be reduced. For this, an electromagnetic continuous casting method using a crucible formed of graphite or quartz, which is a casting material for solidifying the ingot, with no casting loss, has begun being used.

In such an electromagnetic continuous casting method, silicon, which is a source material, is a semiconductor material having a very high melting point and low electrical conductivity. Since a cooling effect caused by discharge of radiant heat is large, whereas a heating effect caused by induction heating is small, an effective supply of a heating source is needed to efficiently and continuously melt a charged source material.

An auxiliary heat source combined with a plasma arc is energized to supply a heat source. Here, a solid material, in which a plasma heat source is charged on an upper surface of a molten material, is heated to a melting point of 1414° C., and then, when surface melting occurs, heat of fusion is needed to cause a phase change to a liquid phase. Accordingly, a heating and melting process of the charged source material, which is continuously introduced, to a melting temperature, should be continuously performed.

The electromagnetic continuous casting method combined with a conventional single plasma arc torch horizontal scanning method requires a lengthy amount of time to form molten silicon for a continuous casting by melting initial solid silicon, and a side arc is generated between a plasma torch and an inner wall surface.

In addition to the side arc generated between the plasma torch and the inner wall surface, when the horizontal scanning method is used, a single torch moves to generate thermal imbalance and local variation in thermal density between areas of the source material, thereby limiting fusibility of the source material.

Further, when capacity of a horizontal scanning plasma torch is increased to improve fusibility, since calorie applied to a heating surface is excessive, volatilization of the molten silicon and generation of silicon fume (solid particles in smoke phase) increase, and thus, the fusibility and purity of the molten material decrease.

SUMMARY OF THE INVENTION

In order to solve the problems, the present invention provides a plurality of plasma arc torches disposed to improve the casting speed of silicon.

The present invention also provides a plurality of plasma arc torches disposed to uniformly heat a source material, wherein positions of the arc torches can be adjusted through a simple operation.

Additional aspects and/or advantages of the invention will be set forth in part in the description which follows and, in part, will be obvious from the description, or may be learned by practice of the invention.

In order to accomplish the object, the present invention provides an apparatus for adjusting a position of a plasma arc torch, which includes: an elevation apparatus configured to raise and lower the plasma arc torch with respect to molten silicon; a rotary apparatus configured to circumferentially rotate the plasma arc torch with respect to the molten silicon; and an angle adjustment apparatus configured to adjust an angle of the plasma arc torch with respect to the molten silicon, wherein a plurality of plasma arc torches are radially disposed.

The elevation apparatus may include an elevation motor; a driving gear connected to the elevation motor to transmit power; a screw jack meshed with the driving gear to be rotated; and an elevation plate connected to the screw jack to be interlocked with rotation of the screw jack to be raised and lowered.

The rotary apparatus may include a rotary motor; a driving belt configured to receive the power from the rotary motor to be rotated; and a rotary plate, on which the driving belt is wound, interlocked with rotation of the driving belt to be rotated.

The angle adjustment apparatus may include an angle adjustment motor; a cam gear configured to convert the power transmitted from the angle adjustment motor into straight movement; and a torch connecting member interlocked with rotation of the cam gear to move in a radial direction and connected to the plasma arc torch to enable rotation.

The angle adjustment apparatus may further include a fixing part, which is a rotational center of the plasma arc torch, fixed to the rotary plate.

A bevel gear may be installed at a motor shaft of the angle adjustment motor to transmit power to the cam gear.

A connecting pin inserted into a cam slit formed in the cam gear may be provided at the torch connecting member.

Four plasma arc torches may be disposed at 90° intervals in a circumferential direction.

BRIEF DESCRIPTION OF THE DRAWINGS

The above and other objects, features and advantages of the present invention will become more apparent to those of ordinary skill in the art by describing in detail example embodiments thereof with reference to the attached drawings, in which.

DETAILED DESCRIPTION OF EXAMPLE EMBODIMENTS

Hereinafter, an exemplary embodiment of an apparatus for adjusting a position of a plasma arc torch in accordance with the present invention will be described with reference to the accompanying drawings.

Figure 1:
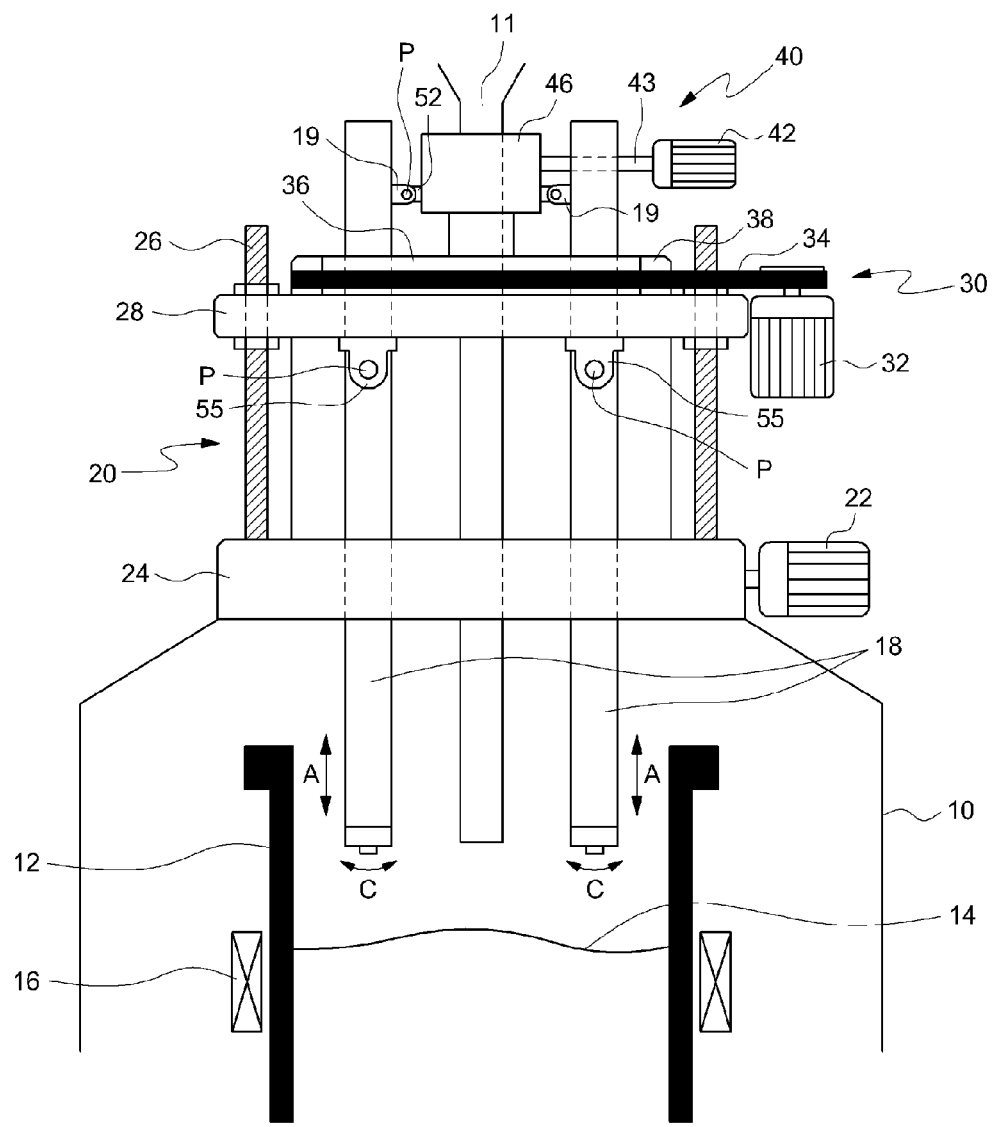
FIG. 1 is a view showing an apparatus for adjusting a position of a plasma arc torch in accordance with the present invention.
Figure 2:
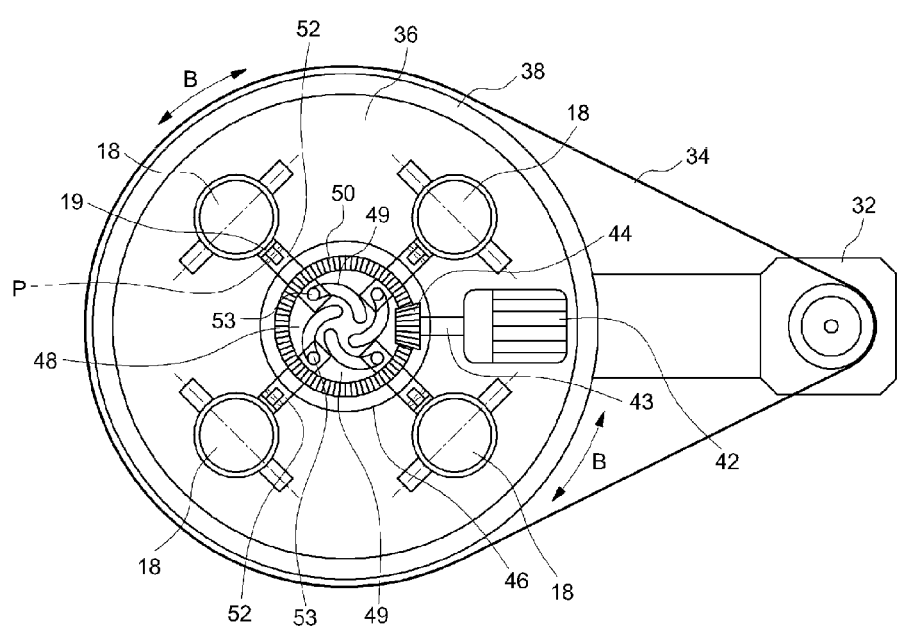
FIG. 2 is a plan view showing a configuration of an angle adjustment apparatus constituting an embodiment of the present invention.
Figure 3:
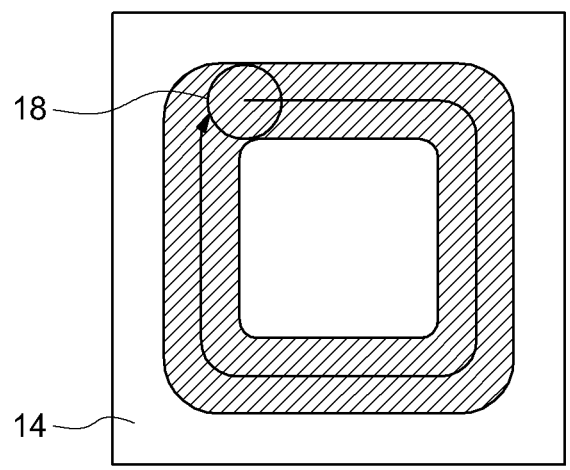
FIG. 3 is a view showing a heating region of a molten silicon surface according to a conventional example.
Figure 4:
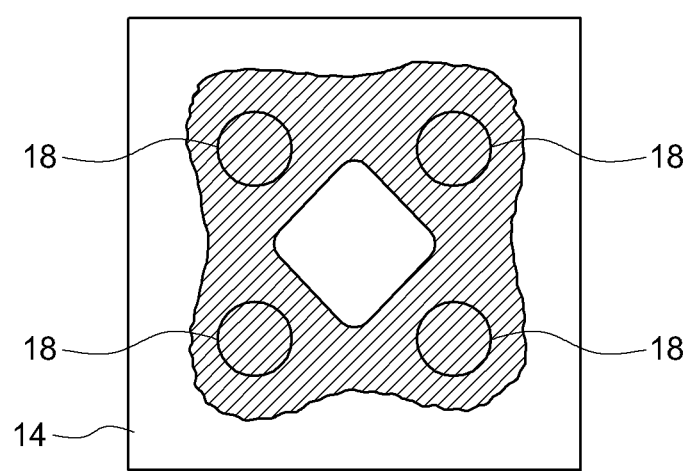
FIG. 4 is a view showing a heating region of a molten silicon surface in accordance with an exemplary embodiment of the present invention.

FIG. 1 is a view showing an apparatus for adjusting a position of a plasma arc torch in accordance with the present invention, FIG. 2 is a plan view showing a configuration of an angle adjustment apparatus constituting an embodiment of the present invention, FIG. 3 is a view showing a heating region of a molten silicon surface according to a conventional example, and FIG. 4 is a view showing a heating region of a molten silicon surface in accordance with an exemplary embodiment of the present invention.

As shown in the drawings, the apparatus for adjusting the position of the plasma arc torch in accordance with the present invention includes an elevation apparatus configured to raise and lower a plasma arc torch 18 with respect to molten silicon 14, a rotary apparatus configured to circumferentially rotate the plasma arc torch 18 with respect to the molten silicon 14, and an angle adjustment apparatus configured to adjust an angle of the plasma arc torch 18 with respect to the molten silicon 14. In addition, a plurality of plasma arc torches 18 may be provided and radially disposed at predetermined intervals.

First, a source material supply part 11 configured to supply a source material is lengthily formed at a center of a chamber 10 in a vertical direction. In addition, a crucible 12 in which silicon is to be melted is installed in the chamber 10. Further, the molten silicon 14 formed by melting the silicon is formed in the crucible 12 to a predetermined height. The molten silicon 14 may be varied in height according to amount and particle size of the introduced source material.

In addition, an induction coil 16 is installed at a side surface of the crucible 12. A plurality of slits are formed at the side surface of the crucible 12 in a longitudinal direction thereof. The slits allow a magnetic field generated by a radio frequency current flowing through the induction coil 16 to pass through the inside of the crucible 12, generating an induction current from the source material. Due to Joule's heating effect according to the induction current, the charged source material, which is continuously supplied, is heated and melted, and an electromagnetic force is generated toward an inner wall of the crucible 12 to reduce contact between the molten material and the inner wall of the crucible 12. Accordingly, the molten silicon is solidified toward a lower side of the crucible 12 to be extracted, and when the source material is continuously supplied, a directionally solidified silicon ingot is continuously manufactured.

Meanwhile, the plasma arc torch 18 is installed over the molten silicon 14 to be spaced a predetermined distance from the molten silicon 14. In this embodiment, a plurality of plasma arc torches 18 may be provided and radially disposed at predetermined intervals. This is because the plurality of plasma arc torches 18 can more effectively heat the molten silicon 14 than the single plasma arc torch 18.

Referring to FIGS. 2 and 4, four plasma arc torches 18 are disposed at predetermined intervals of 90° in a circumferential direction. A heating region of the plasma arc torches 18 disposed as above is shown well in FIG. 4. Meanwhile, since the conventional single plasma arc torch 18 shown in FIG. 3 is moved in an arrow direction to heat the molten silicon 14, the molten silicon 15 may be unevenly heated. However, since the plurality of plasma arc torches 18 of the present invention are radially disposed, even in a state in which the molten silicon 14 is fixed to each area, the molten silicon 14 can be uniformly heated.

Hereinafter, a configuration of an elevation apparatus 20 configured to adjust the distance between the plasma arc torch 18 and the molten silicon 14 will be described with reference to FIG. 1. The elevation apparatus 20 includes an elevation motor 22, a driving gear 24 connected to the elevation motor 22 to transmit power, a screw jack 26 engaged with the driving gear 24 to be rotated, and an elevation plate 28 connected to the screw jack 26 to be interlocked with rotation of the screw jack to be raised and lowered. The elevation plate 28 is provided to fix the plasma arc torch 18.

Accordingly, when the elevation motor 22 is rotated in a normal direction or a reverse direction by an operator, the elevation plate 28 is raised and lowered in the direction of an arrow A to raise and lower the plasma arc torch 18. That is, when height of the molten silicon 14 is varied, the elevation motor 22 is correspondingly driven to vary the height of the plasma arc torch 18, performing effective heating at an appropriate height.

Next, a configuration of a rotary apparatus 30 configured to rotate the plasma arc torch 18 will be described with reference to FIG. 2. The rotary apparatus 30 includes a rotary motor 32, a driving belt 34 configured to receive power from the rotary motor 32 to be rotated, and a rotary plate 36, on which the driving belt 34 is wound, to be interlocked and rotated with rotation of the driving belt 34.

A rotary gear 38 is installed at an outer circumference of the rotary plate 36, and the driving belt 34 is wound on the rotary gear 38 to be engaged therewith. In addition, the plasma arc torch 18 is fixedly coupled to the rotary plate 36. Meanwhile, the elevation plate 28 and the rotary plate 36 may be fixedly coupled with each other, or may be separately provided to be individually driven by the elevation motor 22 and the rotary motor 32.

When the rotary motor 32 is rotated in a normal direction or a reverse direction by an operator, the rotary plate 36 is rotated in the direction of an arrow B, and the plasma arc torches 18 fixed to the rotary plate 36 are moved in the circumferential direction. As a result, since the plasma arc torches 18 can be positioned at sidewalls or corners such that the molten silicon 14 can be smoothly heated according to the fixed positions of the plasma arc torches 18, interference of the charged source material and distribution of the heating area are advantageous at the surface of the molten silicon 14 so that a uniform heating surface advantageous for silicon melting using the plasma arc torches 18 can be generally obtained. Finally, a configuration of an angle adjustment apparatus 40 configured to adjust the angle of the plasma arc torch 18 will be described with respect to FIGS. 1 and 2. The angle adjustment apparatus 40 generally includes an angle adjustment motor 42, a cam gear 48 configured to convert the power transmitted from the angle adjustment motor 42 into straight movement, and a torch connecting member 52 interlocked with rotation of the cam gear 48 to move in a radial direction and connected to the plasma arc torch 18.

A bevel gear 44 is installed at a front end of a motor shaft 43 of the angle adjustment motor 42. In addition, the bevel gear 44 is meshed with a gear part 50 formed at an outer circumference of the cam gear 48. Meanwhile, the cam gear 48 is installed in a cam gear box 46, and functions to convert the rotation movement transmitted from the angle adjustment motor 42 into straight movement.

For this, the cam gear 48 has a plurality of cam slits 49. The cam slits 49 have a predetermined radius of curvature. In this embodiment, four cam slits are disposed in substantially perpendicular directions. A connecting pin 53 of the torch connecting member 52 is inserted into the cam slit 49 to be guided. Accordingly, when the cam gear 48 is rotated, the torch connecting member 52 is straightly moved in the radial direction to adjust the angle of the plasma arc torch 18.

Specifically, the torch connecting member 52 is connected to a connecting part 19 and a rotary pin P of the plasma arc torch 18 to be axially rotated in a specific direction. In addition, referring to FIG. 1, the plasma arc torch 18 is rotatably connected to a fixing part 55 installed at the elevation plate 28 by the rotary pin P. Here, the fixing part 55 becomes the rotational center of the plasma arc torch 18. Accordingly, when the torch connecting member 52 is straightly moved in a leftward/rightward direction of FIG. 1, the plasma arc torch 18 is rotated in the direction of an arrow C about the fixing part 55. As described above, the angle adjustment apparatus adjusts the angle of the plasma arc torch 18 with respect to the molten silicon 14 so that a sidewall or a center side of the molten silicon 14 can be heated.

While the angle adjustment apparatus is configured to transmit power by the bevel gear 44, the present invention is not limited thereto but the power may be transmitted by a plain gear, a worm gear, and so on.

Hereinafter, operation of the apparatus for adjusting the position of the plasma arc torch in accordance with the present invention will be described in detail.

First, in the present invention, the four plasma arc torches 18 are radially disposed. Accordingly, as shown in FIG. 4, the heating region is increased and the entire molten silicon 14 can be uniformly heated in comparison with FIG. 3 of the conventional art.

In addition, as described above, the plasma arc torch 18 is constituted by the elevation apparatus, the rotary apparatus and the angle adjustment apparatus to be easily operated by an operator. Accordingly, the distance and/or the angle between the plasma arc torch 18 and the molten silicon 14 according to the amount and particle size of the supplied source material can be adjusted, and the sidewalls, the corners and the center of the source material, which are not easily heated, can be sufficiently heated, so that fusibility of the source material and purity of the molten material can be improved.

Meanwhile, experiment data obtained by comparing measurement values when the source material is heated by the plurality of plasma arc torches 18 of the present invention with the conventional single plasma arc torch 18 are shown as follows.

First, it will be appreciated that the initial melting time is remarkably reduced in comparison with the conventional art. As described above, as the initial melting time is reduced, the entire process speed can be increased. In addition, it will be appreciated that the induction power output is also reduced by about 200 kW in comparison with the conventional art. On the other hand, it will be appreciated that, since four plasma arc torches 18 are used, instead of just one, the plasma output is increased and the total output is reduced in comparison with the conventional art. In conclusion, according to the apparatus for adjusting the position of the plasma arc torch in accordance with the present invention, initial preparation time for continuous casting can be reduced, extraction speed can be increased, and high quality silicon ingot can be casted.

As can be seen from the foregoing, the present invention provides a plurality of plasma arc torches, which are radially disposed, and each arc torch is configured such that the distance and angle of the torch with respect to the molten silicon can be adjusted. Accordingly, since the position of the plasma arc torch can be easily adjusted according to an increase in the introduction amount of the silicon source material or variation in particle size of the source material, the time consumed to form the initial molten silicon formed by melting solid silicon can be reduced and casting speed can be increased.

In addition, since the radially disposed plasma arc torches can uniformly heat the entire molten silicon, fusibility can be improved and the source material can be stably melted, so that economic continuous casting can be performed and a high quality silicon ingot for a solar cell can be manufactured.

While the invention has been shown and described with reference to certain example embodiments thereof, it will be understood by those skilled in the art that various changes in form and details may be made therein without departing from the spirit and scope of the invention as defined by the appended claims.

What is claimed is:

1. An apparatus for adjusting a position of a plurality of plasma arc torches, comprising:
    an elevation apparatus configured to raise and lower the plurality of plasma arc torches with respect to molten silicon;
    a rotary apparatus configured to circumferentially rotate the plurality of plasma arc torches with respect to the molten silicon; and
    an angle adjustment apparatus configured to adjust an angle of the plurality of plasma arc torches with respect to the molten silicon,
    wherein the plurality of plasma arc torches are radially disposed.

2. The apparatus according to claim 1, wherein the elevation apparatus comprises:
    an elevation motor;
    a driving gear connected to the elevation motor to transmit power;
    a screw jack meshed with the driving gear to be rotated; and
    an elevation plate connected to the screw jack to be interlocked with rotation of the screw jack to be raised and lowered.

3. The apparatus according to claim 1, wherein the rotary apparatus comprises:
    a rotary motor;
    a driving belt configured to receive power from the rotary motor to be rotated; and
    a rotary plate, on which the driving belt is wound, interlocked with rotation of the driving belt to be rotated.

4. The apparatus according to claim 1, wherein the angle adjustment apparatus comprises:
    an angle adjustment motor;
    a cam gear configured to convert power transmitted from the angle adjustment motor into straight movement; and
    a torch connecting member interlocked with rotation of the cam gear to move in a radial direction and connected to the plurality of plasma arc torches to enable rotation.

5. The apparatus according to claim 2, further comprising a fixing part, which is a rotational center of the plurality of plasma arc torches, fixed to the elevation plate.

6. The apparatus according to claim 4, wherein a bevel gear is installed at a motor shaft of the angle adjustment motor to transmit power to the cam gear.

7. The apparatus according to claim 6, wherein a connecting pin inserted into a cam slit formed in the cam gear is provided at the torch connecting member.

8. The apparatus according to claim 1, wherein four plasma arc torches are disposed at 90° intervals in a circumferential direction.

9. The apparatus according to claim 2, wherein the rotary apparatus comprises:
- a rotary motor;
- a driving belt configured to receive power from the rotary motor to be rotated; and
- a rotary plate, on which the driving belt is wound, interlocked with rotation of the driving belt to be rotated.

* * * * *